United States Patent
Pinkerton et al.

(10) Patent No.: US 12,275,637 B2
(45) Date of Patent: Apr. 15, 2025

(54) MEMBRANE-BASED NANO-ELECTROMECHANICAL SYSTEMS DEVICE AND METHODS TO MAKE AND USE SAME

(71) Applicant: Clean Energy Labs, LLC, Austin, TX (US)

(72) Inventors: Joseph F. Pinkerton, Austin, TX (US); Alexander Joseph Pinkerton, Austin, TX (US)

(73) Assignee: Clean Energy Labs, LLC, Austin, TX (US)

(*) Notice: Subject to any disclaimer, the term of this patent is extended or adjusted under 35 U.S.C. 154(b) by 510 days.

(21) Appl. No.: 17/602,919

(22) PCT Filed: Apr. 10, 2020

(86) PCT No.: PCT/US2020/027842
§ 371 (c)(1),
(2) Date: Oct. 11, 2021

(87) PCT Pub. No.: WO2020/210756
PCT Pub. Date: Oct. 15, 2020

(65) Prior Publication Data
US 2022/0177302 A1 Jun. 9, 2022

Related U.S. Application Data

(60) Provisional application No. 62/832,420, filed on Apr. 11, 2019.

(51) Int. Cl.
*B82B 1/00* (2006.01)
(52) U.S. Cl.
CPC .................. *B82B 1/005* (2013.01)

(58) Field of Classification Search
CPC .............. B82B 1/005; B81B 3/0086; B81B 2201/0221; B81B 2201/0292; B81B 2203/0127; G01R 33/0286
See application file for complete search history.

(56) References Cited

U.S. PATENT DOCUMENTS

| | | |
|---|---|---|
| 2014/0270271 A1 | 9/2014 | Dehe et al. |
| 2015/0180372 A1* | 6/2015 | Pinkerton ............ G02B 7/1821 977/774 |

(Continued)

FOREIGN PATENT DOCUMENTS

WO 2013192335 A1 12/2013

OTHER PUBLICATIONS

Tambe et al. ("Micro/nanotribological characterization of PDMS and PMMA used for BioMEMS/NEMS applications," Ultramicroscopy 105, 238-247, 2005) (Year: 2005).*

(Continued)

*Primary Examiner* — Yasser A Abdelaziez
(74) *Attorney, Agent, or Firm* — Dickinson Wright PLLC; Ross Spencer Garsson

(57) ABSTRACT

Nano-electromechanical systems (NEMS) sensor devices that utilize thin electrically conductive membranes, which can be, for example, graphene membranes. The NEMS devices can have a trough shape (such as a serpentine shape arrangement) of the electrically conductive membrane. The thin, electrically conductive membrane has membrane-structures disposed upon it in an array of cavities. These membrane structures are between the thin, electrically conductive membrane and the main membrane trace. Such an arrangement increases the sensitivity of the NEMS sensor device. The electrically conductive membrane can be controllably wicked down on the edge of the oxide cavity to increase the sensitivity of the NEMS sensor device. Such NEMS sensor devices include NEMS sensor devices that are (Continued)

well suited to applications that measure magnetic fields that, operate below 10 kHz, such as brain-computer interfaces.

24 Claims, 13 Drawing Sheets

(56) References Cited

U.S. PATENT DOCUMENTS

2018/0201511 A1   7/2018  Ruhl et al.
2020/0092655 A1*  3/2020  Jiang .................. H10N 30/2044

OTHER PUBLICATIONS

Dong et al. ("Application of mechanical stretch to tune the resonance frequency of hyperelastic membrane-based energy harvesters," Sensors and Actuators A 252, pp. 165-173, 2016) (Year: 2016).*

Authorized Officer Veronique Cornudet; International Search Report and Written Opinion; PCT/US2020/027842; dated Oct. 29, 2020; 22 pages.

Berger, Christian et al.; "Capacitive Pressue Sensing with Suspended Graphene-Polymer Heterostructure Membranes"; Nanoscale, 2017, 9; pp. 17439-17449.

Davidovikj, Dejan et al.; "Graphene Gas Pumps"; MEMS 2018, Belfast, Northern Ireland, UK; Jan. 21-25, 2018; pp. 628-631.

* cited by examiner

MEMBRANE-BASED NANO-ELECTROMECHANICAL SYSTEMS DEVICE AND METHODS TO MAKE AND USE SAME

RELATED PATENTS AND PATENT APPLICATIONS

This application is a 35 U.S.C § 371 national application of PCT Application No. PCT/US20/27842, filed on Apr. 10, 2020, entitled "Membrane-Based Nano-Electromechanical Systems Device And Methods to Make And Use Same", which claims priority to U.S. Provisional Patent Application Ser. No. 62/832,420, filed Apr. 11, 2019, entitled "Membrane-Based Nano-Electromechanical Systems Device And Methods to Make And Use Same."

This application is also related to International PCT Patent Application Serial No. PCT/US2019/068787, entitled "Membrane-Based Nano-Electromechanical Systems Device And Methods To Make And Use Same," filed Dec. 27, 2019, which claims priority to U.S. Provisional Patent Application Ser. No. 62/785,551, entitled "Membrane-Based Nano-Electromechanical Systems Device And Methods To Make And Use Same," filed Dec. 27, 2018.

These patent applications are commonly assigned to the Assignee of the present invention and are incorporated herein by reference in their entirety for all purposes.

TECHNICAL FIELD

The present invention relates to membrane-based nano-electromechanical systems (NEMS) devices and methods to make and use such devices.

BACKGROUND

A class of small devices exists that are referred to as micro-electromechanical systems (MEMS). Each major dimension of a MEMS device is generally on the order of 1-100 microns (thus "micro"). MEMS devices typically range in size from 20 µm to 1 mm. The devices often include a central unit that processes data and several components that interact with the outside environment, such as sensors. The usage of MEMS devices has dramatically increased over the past several years as companies have integrated MEMS chips into consumer products, such as cell phones and computers.

Such uses include: as sensors, electrical relays, adjustable-angle mirror devices, variable impedance devices, and devices that perform other functions (such as transducers and actuators).

The types of commercial applications include:

Gyroscopes and accelerometers, such as the gyroscope/accelerometer chips used in cell phones to re-orient the screen when turned 90 degrees and allow users to interact with cell phones in more complex ways. MEMS devices are used as gyroscopes in automobiles and other devices to detect yaw, pitch, and roll. This can be used to deploy a roll over bar or to trigger dynamic stability control. MEMS devices are also used as accelerometers in game controllers, personal media players, and digital cameras. They are also used in personal computers to park the hard disc head, when free-fall is detected, to prevent damage and data loss. MEMS devices have also been used in accelerometers in cars, such as to deploy airbags during a collision.

Microphones, such as microphones in cell phones, head sets, and lap top computers.

Magnetometers, such as magnetometers to perform the compass function in cell phones.

Sensors, such as pressure sensors in car tire pressure sensors or blood pressure sensors.

Further, for example, biosensors and chemosensors used in medical- and health-related technologies.

Inkjet printers, such as inkjet printers that use piezoelectrics or thermal bubble ejection to deposit ink on paper.

Displays, such as used in digital micro-mirror devices in projectors or such as for interferometric modulator displays.

Optical switching, such as used for switching technology and alignment for data communication.

Fluid flow, such as for micro-cooling systems.

Although MEMS devices are relatively small, MEMS devices are technologically complex structures that cost more per unit wafer area than CMOS chips to fabricate.

U.S. Pat. No. 9,515,580, entitled "Membrane-Based Nano-Electromechanical Systems Device and Methods To Make And Use Same," issued Dec. 6, 2016, to Pinkerton el al. (the "Pinkerion '580 patent") provides for nano-electromechanical systems (NEMS) devices that utilize thin electrically conductive membranes, which can be, for example, graphene membranes. Such membrane-based NEMS devices can be used as sensors, electrical relays, adjustable angle mirror devices, variable impedance devices, and devices performing other functions. The Pinkerton '580 patent is incorporated by reference herein in its entirety.

The Pinkerton '580 patent discloses and teaches membrane-based NEMS devices. One exemplary devices is shown in FIGS. 1A-1B (which are FIGS. 3A-3B, respectively, in the Pinkerton '580 patent). FIG. 1A depicts an overhead view of a 4-spoke membrane-based NEMS device 300. Lower traces 302a, 302b, 302c, and 302d can be used as gates/drivers, middle traces 303s, 303b, 303c, and 303d can be used as drains/sensors, and upper traces 304a, 304b, 304c, and 304d can be used as sources. The membrane-based NEMS device 300 also includes an electrically conductive membrane 305 (graphene). The membrane-based NEMS device 300 can have drain/sensor trace widths (such as the widths of middle traces 303a and 303c) that are each unique so that tilting motion of a cylinder (such as a metal cylinder) (not shown in FIG. 3) can be differentiated from planer motion in the x-y plane.

Cross-section A-A, as given in FIG. 1A, is shown by the side view depicted in FIG. 1B. FIG. 1B shows how the electrically conductive membrane 305 (graphene) can be deflected (shown by solid and dashed lines) with the lower traces (302a and 302b). Maintaining the smallest possible gap between the electrically conductive membrane 305 (graphene) and lower traces (traces 303a and 303e as shown in FIG. 33) dramatically increases the sensitivity of the membrane-based NEMS device 300 because capacitance is inversely proportional to this gap.

FIG. 2 (which is FIG. 4 in the Pinkerton '580 patent) depicts a membrane-based NEMS device 400 from the same cross-sectional side view as shown for membrane-based NEMS device 300 in FIG. 18. In FIG. 2, the membrane-based NEMS device 400 is a membrane-based NEMS sensor that is sensing an external magnetic field B 406 along the y-axis. Current (1407) from upper trace 404a, through the electrically conductive membrane 405 (graphene) and to upper trace 404c interacts with magnetic field B 406 to create a force F 408 along the z-axis. This force F 408 deflects the electrically conductive membrane 405 (e.g., graphene) in the direction of the z-axis (upward as illustrated in FIG. 2), increasing the gap between the electrically conductive membrane 405 and middle traces (such as middle traces 403a and 403c), which in turn lowers the capacitance between the upper traces (such as upper traces 404a and 404c) and the middle traces (such as middle traces 403a and 403c). This reduction in capacitance is related to the strength and direction of the external magnetic field B 406; therefore, the membrane-based NEMS device 400 is a magnetic field sensor (a membrane-based NEMS magnetic field sensor).

To increase the sensitivity of such a membrane-based NEMS magnetic field sensor 400, current (i 407) can be pulsed through the electrically conductive membrane 405 (graphene) at an electrical frequency equal to the mechanical resonant frequency of the electrically conductive membrane 405 (e.g., graphene), thus increasing the deflection of the electrically conductive membrane 405 (e.g., graphene) and related capacitance change.

The membrane-based NEMS device 400 can operate in air or vacuum, but will be more sensitive in vacuum because the current and the quality factor of the electrically conductive membrane 405 (e.g., graphene) resonance can be higher.

FIG. 3 (which is FIG. 5 in the Pinkerton '580 patent) shows how magnetic field B 507 can be measured along the z-axis (perpendicular to the plane of the electrically conductive membrane 505) with a metal cylinder 506 (or other material) mounted to the electrically conductive membrane 505. Similar to as shown in FIG. 2, the force from the AC current (i 508) is along the y-axis. Again, the electrical frequency can be optimally set to the mechanical frequency of the electrically conductive membrane 505 and the metal cylinder 506. The CM of metal cylinder 506 will oscillate through the y-z plane, and this oscillation will cause corresponding changes in capacitance between middle trances and the upper traces (which are related to the strength of the magnetic field B 507).

Nano-electromechanical systems (NEMS) devices that utilize thin, electrically conductive membranes (referred to herein as "membrane-based NEMS devices"). The thin membrane is generally on the order of one nanometer. The thin membrane can be made of graphene; however, other electrically conductive membranes (such as reduced graphene oxide) or semiconductor-based membranes (such as molybdenum disulfide) can be used.

The membrane-based NEMS devices can be used as sensors ("membrane-based NEMS sensors"), electrical relays ("membrane-based NEMS relays"), adjustable-angle mirror devices ("membrane-based NEMS adjustable-angle mirrors"), variable impedance devices ("membrane-based NEMS variable impedance devices"), and devices performing other functions.

SUMMARY OF THE INVENTION

Improved NEMS devices based upon a serpentine shape arrangement of the electrically conductive membrane (e.g., graphene) have been discovered. Such serpentine shape arrangement can be used for improved membrane-based NEMS devices, membrane-based NEMS sensors, membrane-based NEMS relays, membrane-based NEMS adjustable-angle mirrors, and ("membrane-based NEMS variable impedance devices. In some embodiments, the electrically conductive membrane (i.e., the graphene) is controllably "wicked down" on the edge of the oxide cavity to increase the sensitivity of the device.

For instance, this serpentine shape arrangement provides an improved magnetic flux density (B) sensor, including to sense magnetic flux density (B) signals in all three directions (a three axis sensor). Moreover, this design can also be used to approximately cancel self-generated magnetic fields by the NEMS device (created by currents flowing through the electrically conductive membrane (e.g., graphene)) because the serpentine arrangement can provide an equal number of oppositely directed currents in each of the NEMS. This will prevent the device from being overwhelmed by its own magnetic fields.

Such NEMS devices include NEMS sensor device that are well suited to applications that measure magnetic fields operating below 10 kHz, such as brain-computer interfaces.

In general, in one aspect, the invention features a nano-electromechanical system sensor device that has a section that is oriented along a first plane. The section includes a thin, electrically conductive membrane having a first end and a second end. The thin, electrically conductive membrane has a membrane structure deposited on the thin, electrically conductive membrane. The section further includes a substrate oriented parallel to the first plane. The substrate includes a cavity having a substrate metal trace on the substrate. The thin, electrically conductive membrane is parallel to the first plane. The thin, electrically conductive membrane bounds the cavity. The section further includes a first connector electrically connected to the first end of the thin, electrically conductive membrane. The section further includes a second connector electrically connected to the second end of the thin, electrically conductive membrane, such that current is operable to flow through the thin, electrically conductive membrane between the first connector and the second connector causing the thin, electrically conductive membrane facing the cavity to deflect in a direction perpendicular to the first plane in the presence of a magnetic field.

Implementations of the invention can include one or more of the following features:

The substrate can include a plurality of cavities. The thin, electrically conductive membrane can bound the plurality of the cavities and provide for a plurality of portions of the thin, electrically conductive membrane that are bound to the plurality of the cavities.

The plurality of cavities can be arranged in a plurality of rows.

The plurality of rows can include a first portion of the plurality of rows and a second portion of the plurality of rows. The deflection of the thin, electrically conductive membrane in a direction perpendicular to the first plane can include (i) a first set of deflections in which the portions of the thin, electrically conductive membrane facing the first portion of the plurality of rows deflect in a direction toward the substrate and the portions of the thin, electrically conductive membrane facing the second portion of rows deflect in a direction away from the substrate, and (ii) a second set of deflections in which the portions of the thin, electrically conductive membrane facing the first portion of the plurality of rows deflect in the direction away from the substrate and the portions of the thin, electrically conductive membrane facing the second portion of rows deflect in the direction toward the substrate.

The deflections of the portions of the thin, electrically conductive membrane covering the plurality of cavities in adjacent rows in the plurality of rows can deflect in an equal magnitude and opposite direction.

The thin, electrically conductive membrane can be wicked down on the edge of each of the first plurality of cavities.

The cavity can be in a trough shape.

The substrate can have a substrate non-electrically conductive layer. The thin, electrically conductive membrane can be on the substrate non-electrically conductive layer.

The thin, electrically conductive membrane can be in a serpentine shape.

The membrane structure can include a non-electrically conductive material.

The membrane structure comprises can include electrically conductive material.

The membrane structure can include a non-electrically conductive layer and an electrically conductive layer.

The non-electrically conductive layer can be between the thin, electrically conductive membrane and the electrically conductive layer.

The membrane structure can be between the thin, electrically conductive membrane and the cavity.

The membrane structure can include an electrically conductive layer that is a main membrane trace.

The nano-electromechanical system sensor device can further include a gap sensor within the cavity. The gap sensor can be operable for providing position feedback of the gap between the substrate metal trace and the main membrane trace.

The gap sensor can be operable for reducing the average gap between the substrate metal trace and the main membrane trace, as compared to the nano-electromechanical system sensor device not having the gap sensor.

The average gap can be between 10 nm and 100 nm.

The gap sensor can include two gap sensor traces.

The nano-electromechanical system sensor device can further include a CMOS circuit below the cavity. The CMOS circuit can be operable for measuring the capacitance between the gap sensor and the main membrane trace.

There can be at least two gap sensors within the cavity. The at least two gap sensors can be operable for providing position feedback.

There can be at least four gap sensors within the cavity. The at least four gap sensors can be operable for providing position feedback.

The thin, electrically conductive membrane can be grounded so that the voltage on the substrate metal trace is operable for creating an electrostatic force between the substrate metal traces and the thin, electrically conductive membrane.

The main membrane trace of the thin, electrically conductive membrane can face the substrate metal trace at a gap distance of between 5 nm and 50 nm.

The nano-electromechanical system sensor device can be operable for measuring a magnetic field operating below 10 kHz.

The nano-electromechanical system sensor device can be operable for measuring a magnetic field in a brain-computer interface.

The nano-electromechanical system sensor device can be operable to maintain the thin, electrically conductive membrane bounded in the cavity at a pre-determined resonant frequency.

The nano-electromechanical system sensor device can be operable to compensate for a changing condition when maintaining the thin, electrically conductive membrane bounded in the cavity at a pre-determined resonant frequency.

The changing condition can include a change in temperature.

The nano-electromechanical system sensor device can be operable to compensate for ambient magnetic fields.

The ambient magnetic field can be Earth's magnetic field.

The thin, electrically conductive membrane can have a thickness of approximately one nm.

The thin, electrically conductive membrane can have a thickness between 1 nm and 25 nm.

The thin, electrically conductive membrane can be selected from a group consisting of graphene, graphene oxide, graphene/graphene oxide composites, and electrically conductive polymers.

The thin, electrically conductive membrane can be one layer of graphene.

The thin, electrically conductive membrane can include multiple layers of graphene.

The thin, electrically conductive membrane can include multiple layers of thin strips of graphene located near the center of the cavity in the cavity.

The thin, electrically conductive membrane can include PDMS coated with an electrically conductive material.

The nano-electromechanical systems device can include two sections. The two sections can be perpendicular to one another.

The nano-electromechanical systems device can include three sections. The three sections can be each perpendicular to one another.

The nano-electromechanical system sensor device can be operable to sense an alternating magnetic field signal.

The alternating magnetic field signal can be between 1 and 100 femto-tesla.

The substrate can be a Si wafer.

The substrate non-conductive layer can be an oxide layer.

The nano-electromechanical system sensor device can be operable to adjust tension of the thin, electrically conductive membrane bounded in the cavity to adjust resonant frequency.

The nano-electromechanical system sensor device can be operable to adjust the tension of the thin, electrically conductive membrane to adjust the stiffness of the thin, electrically conductive membrane bounded in the cavity.

The nano-electromechanical system sensor device can include CMOS circuit, a first electrostatic force trace, and a second electrostatic force trace. The CMOS circuit can be operable to measure resonant frequency of the thin, electrically conductive membrane bounded in the cavity. The first electrostatic force trace and the second electrostatic force trace can be operable to adjust the resonant frequency to a desired resonant frequency.

The first electrostatic force trace and the second electrostatic force trace can be operable to increase the tension of the thin, electrically conductive membrane bounded in the cavity by increasing voltage on the first electrostatic force trace while decreasing voltage on the second electrostatic force trace. The first electrostatic force trace and the second electrostatic force trace can be operable to decrease the tension of the thin, electrically conductive membrane bounded in the cavity by decreasing voltage on the first electrostatic force trace while increasing voltage on the second electrostatic force trace.

The nano-electromechanical system sensor device can be operable to adjust the tension of the thin, electrically conductive membrane bounded in the cavity while maintaining a near constant gap between the substrate metal trace and a main membrane trace.

In general, in another aspect, the invention features an apparatus that includes at least one of the above-described nano-electromechanical system sensor devices.

In general, in another aspect, the invention features a method that includes selecting one of the above-described apparatus (including at least one of the above-described nano-electromechanical system sensor devices). The method further includes utilizing the nano-electromechanical system sensor device in the apparatus.

Implementations of the invention can include one or more of the following features:

The nano-electromechanical system sensor device can be utilized to sense the presence of a magnetic field.

The nano-electromechanical system sensor device can include a main membrane trace and a gap sensor within the cavity. The method can include using the gap sensor for providing position feedback of the gap between the substrate metal trace and the main membrane trace.

The method can further include using the gap sensor to reduce the average gap between the substrate metal trace and the main membrane trace, as compared to the nano-electromechanical system sensor device not having the gap sensor.

The nano-electromechanical system sensor device can include a CMOS circuit and a main membrane trace. The method can further include utilizing the CMOS circuit to measure the capacitance between the gap sensor and the main membrane trace in the cavity.

The nano-electromechanical system sensor device can be utilized to measure a magnetic field operating below 10 kHz.

The nano-electromechanical system sensor device can be utilized to measure a magnetic field in a brain-computer interface.

The nano-electromechanical system sensor device can maintain the thin, electrically conductive membrane bounded in the plurality of cavities at a pre-determined resonant frequency.

The nano-electromechanical system sensor device can compensate for a changing condition when maintaining the thin, electrically conductive membrane bounded in the cavity at the pre-determined resonant frequency.

The changing condition can include a change in temperature.

The nano-electromechanical system sensor device can compensate for ambient magnetic fields.

The ambient magnetic field can be Earth's magnetic field.

The method can further include the nano-electromechanical system sensor device adjusting tension of the thin, electrically conductive membrane bounded in the cavity to adjust resonant frequency.

The method can further include the nano-electromechanical system sensor device adjusting the tension of the thin, electrically conductive membrane to adjust the stiffness of the thin, electrically conductive membrane bounded in the cavity.

The method can further include using a CMOS circuit of the nano-electromechanical system sensor device to measure resonant frequency of the thin, electrically conductive membrane bounded in the cavity. The method can further include using a first electrostatic force trace and a second electrostatic force trace to adjust the resonant frequency to a desired resonant frequency.

The method can further include increasing the tension of the thin, electrically conductive membrane bounded in the cavity by increasing voltage on the first electrostatic force trace while decreasing voltage on the second electrostatic force trace. The method can further include decreasing the tension of the thin, electrically conductive membrane bounded in the cavity by decreasing voltage on the first electrostatic force trace while increasing voltage on the second electrostatic force trace.

The tension of the thin, electrically conductive membrane bounded in the cavity can be adjusted while maintaining a near constant gap between the substrate metal trace and a main membrane trace.

The membrane structure can be deposited on the electrically conductive membrane using a chemical vapor deposition process.

DESCRIPTION OF DRAWINGS

FIG. 6A shows half of the electrically conductive membranes (along cross-sectional side view (X-X')) deflecting in one direction, with the other half deflecting in the opposite direction. FIG. 6B shows how the electrically conductive membranes shift to the other positions when the direction of magnetic field reverses so that they each deflect the other way, thus remaining half deflected in one direction and the other half deflected in the opposite direction.

DETAILED DESCRIPTION

The present invention is a nano-electromechanical systems (NEMS) device that utilizes thin, electrically conductive membranes. The thin membrane is generally on the order of one nanometer thick while the other two dimensions are 10-500 microns in dimension.

The thin membrane can be made of graphene. Graphene membranes (also otherwise referred to as "graphene drums or troughs") have been manufactured for limited research purposes using process such as disclosed in Lee et al. Science, 2008, 321, 385-388. A graphene membrane is atomically thin. Graphene sheets—one-atom-thick two-dimensional layers of $sp^2$-bonded carbon—have a range of unique electrical, thermal and mechanical properties. Other atomically thin materials also exist that have their own unique electrical, thermal, and mechanical properties. Such atomically thin materials include graphene oxide and graphene/graphene oxide composites, such as described and discussed in commonly owned U.S. Pat. No. 8,338,728, entitled "Nanoelectromechanical Tunneling Current Switch Systems," issued Dec. 25, 2012, to Pinkerton.

While embodiments of the present invention having graphene are discussed and described herein, the thin membranes utilized in the present invention are not limited to graphene. Rather, the thin membranes can be any thin material that is sufficiently mechanically robust (such as, for example, a thin membrane of graphene oxide, a polymer such as PDMS or any combination of materials that form a sufficiently robust composite material, such as a thin membrane of graphene and graphene oxide) to span the lateral dimensions of the target substrate feature (such as micro or nano wells). Thus, the discussion of graphene is for exemplary purposes and is not intended to limit the scope of the present invention.

Furthermore, the thin membranes used in the present invention are generally a membrane that is atomically thin. For single-layer graphene membranes, the thickness is sub-nanometer; membranes containing multiple graphene layers, graphene/graphene oxide composites, etc. are typically on the order of about 1 to about 25 nanometers.

The membrane-based NEMS device of the present invention can perform the same functions as a MEMS device but are much smaller (generally around 100 times smaller), lower cost, and more facile to design and fabricate.

Such membrane-based NEMS devices can be used to function as accelerometers, magnetometers, gyroscopes, resonators/clocks, thermometers, barometers, variable capacitors, electrical relays, humidity sensors, light reflectors for digital light projectors and optical switching, microphones, pressure sensors (other than microphone) and variable inductors.

Unlike many MEMS, the membrane-based NEMS devices of the present invention can perform more than one of these functionalities simultaneously. Furthermore, the membrane-based NEMS devices of the present invention can also store energy and perform energy harvesting.

Figure 1A:
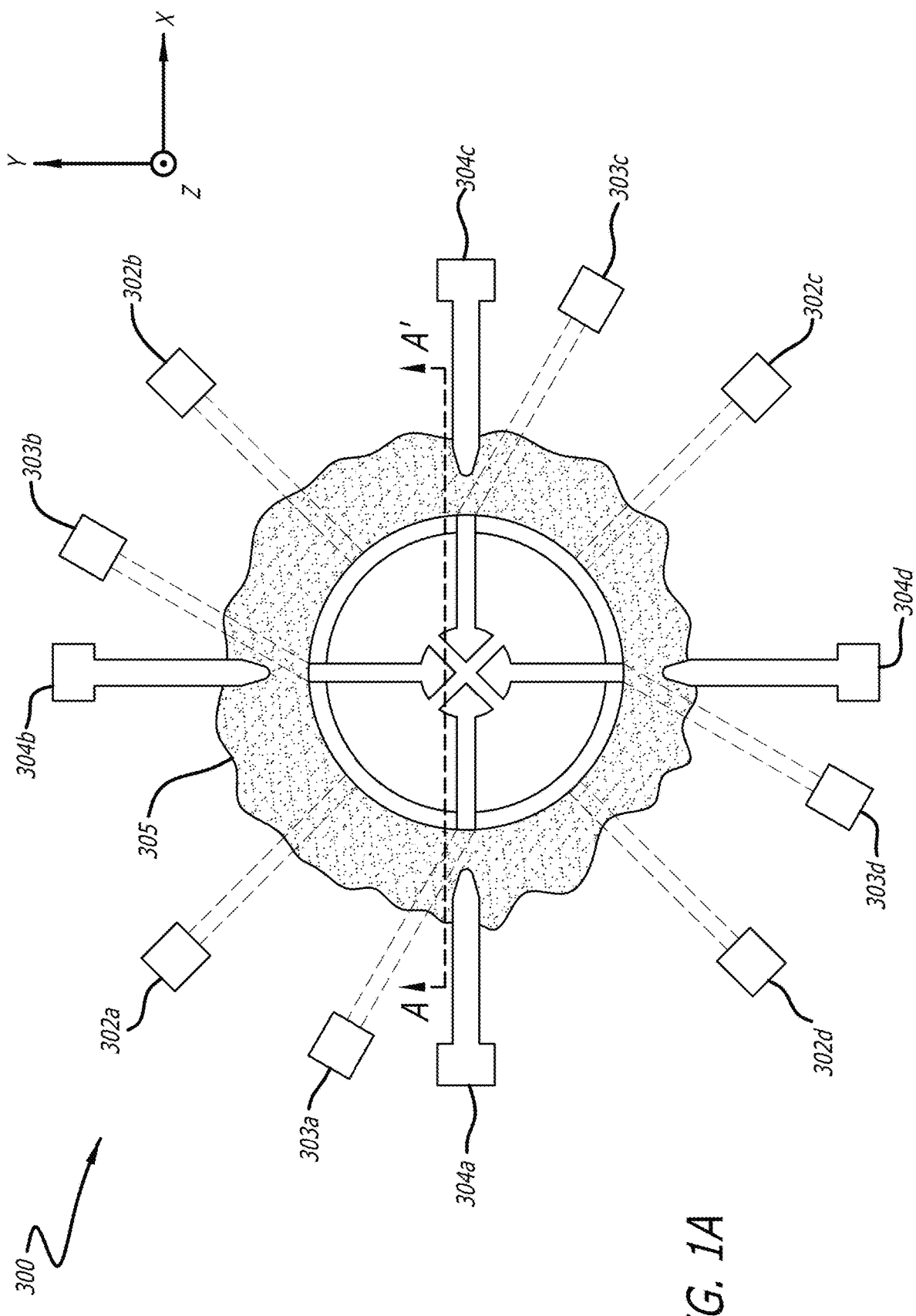
FIG. 1A (which is FIG. 3A in the Pinkerton '580 patent) depicts an overhead view of a membrane-based NEMS device that is an embodiment of the present invention.
Figure 1B:
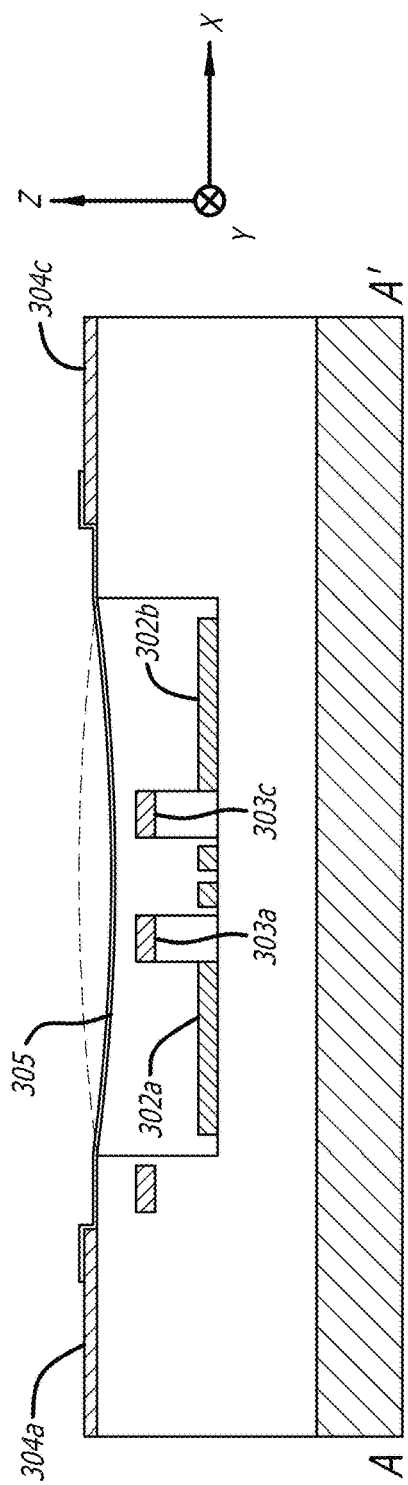
FIG. 1B (which is FIG. 3B in the Pinkerton '580 patent) depicts a cross-sectional side view (A-A') of the membrane-based NEMS device shown in FIG. 1A.
Figure 2:
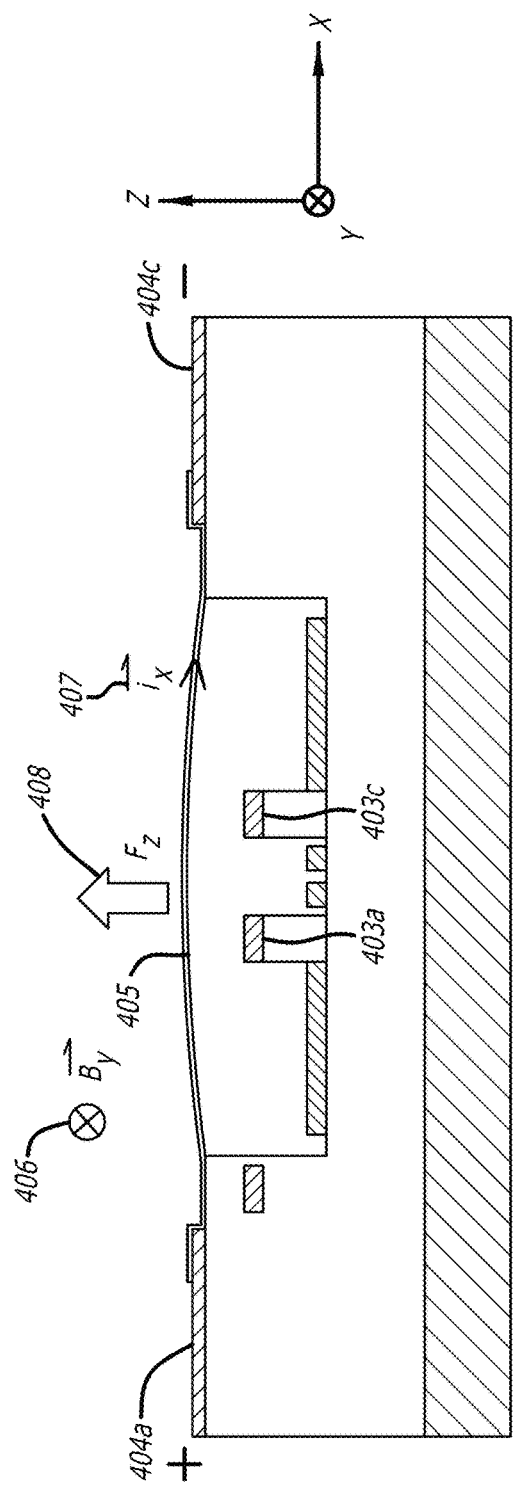
FIG. 2 (which is FIG. 4 in the Pinkerton '580 patent) depicts the same cross-sectional side view of the membrane-based NEMS device as shown in FIG. 13 showing the membrane-based NEMS device sensing an external magnetic field along one axis.
Figure 3:
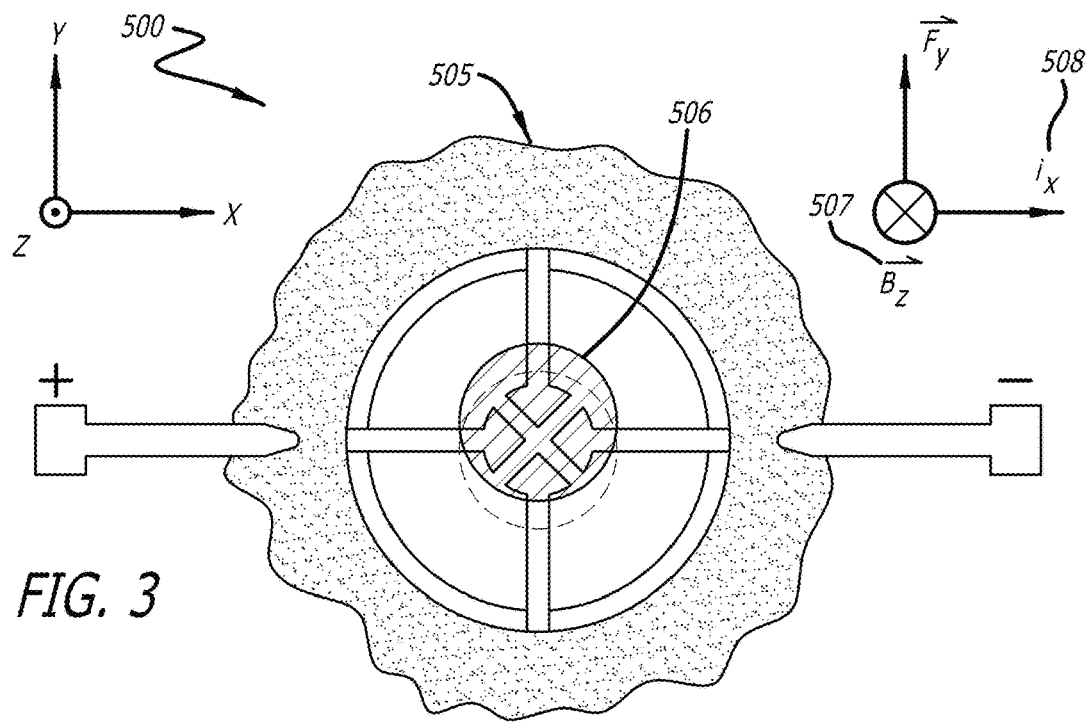
FIG. 3 (which is FIG. 5 in the Pinkerton '580 patent) depicts an overhead view of a membrane-based NEMS device having a metal cylinder on top of the electrically conductive membrane that can be used to measure an external magnetic field along three axes.
Figure 4:
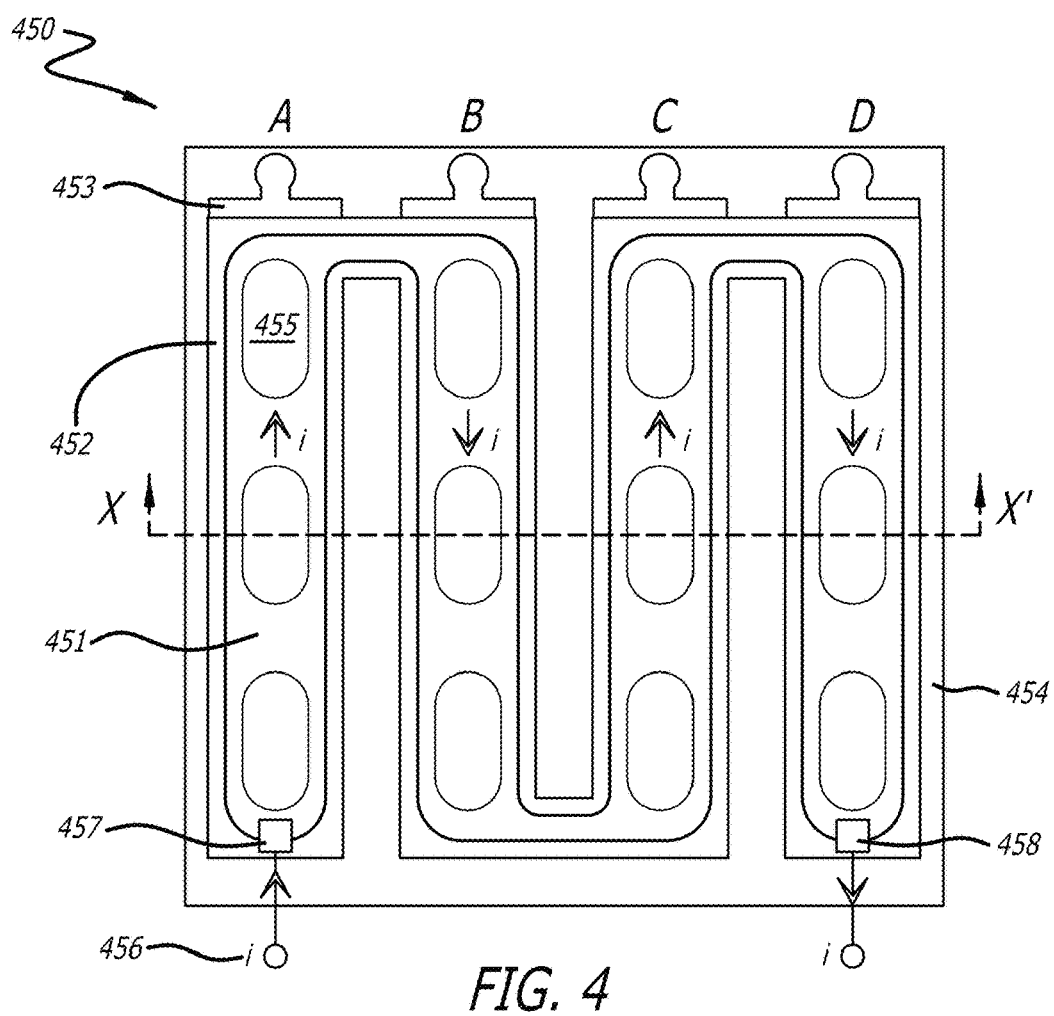
FIG. 4 depicts an illustration of a section of an NEMS device having an electrically conductive membrane in a serpentine shape arrangement. This section of the NEMS device is the electrically conductive membrane trough chip section of the NEMS device.
Figure 5:
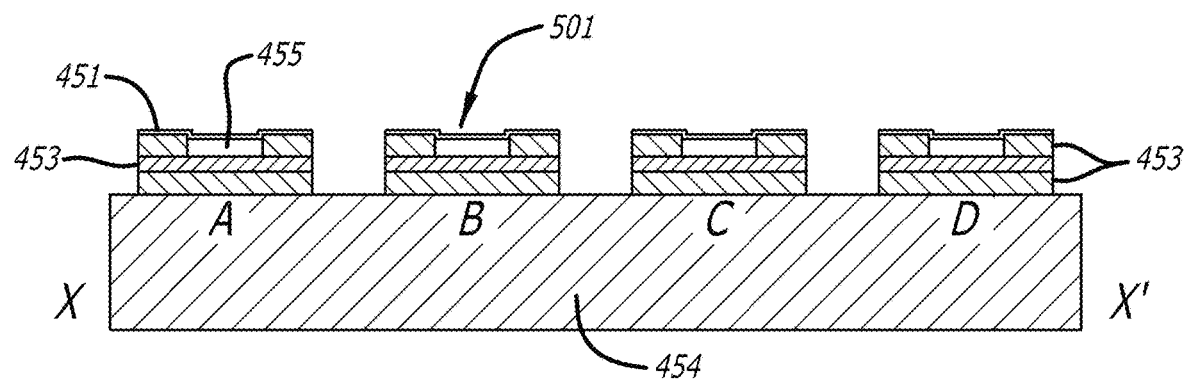
FIG. 5 depicts a cross-sectional side view (X-X') of the section of the NEMS device shown in FIG. 4.

Referring to the figures, FIG. 4 depicts a section 450 of an NEMS device having electrically conductive membrane 451 (graphene) in a serpentine shape arrangement. Section 450 is the electrically conductive membrane trough chip section of the NEMS device. The section 450 further includes oxide 452, metal trace 453 (gold), and a wafer 454 (Si wafer). There are also multiple oxide cavities 455 in which the electrically conductive material is then facing the metal 453 (without oxide 452 therebetween). FIG. 5 depicts a cross-sectional side view (X-X') of the portion of section 450 and shows cross-section views in the oxide cavities 455 in each of rows A-D.

FIG. 4 further shows that a current (i 456) can flow through membrane 450 just above metal trace 453. As shown in FIG. 4, the current (i 456) flowing from connection 457 to connection 458 results in current going in one direction along the x-axis in rows A and C, while going in the opposite direction along the x-axis in rows B and D. Should the current be reversed, this would concurrently reverse the directions of current along each of rows A-D, and thus maintain the symmetry of the current flow.

This serpentine arrangement can reduce the number of 500-2000 ohm contact resistances per suspended graphene trough to 2 (instead of 2 per trough). For a 5 mm×5 mm device this translates into a total resistance (and thus power) reduction of approximately a factor of 60.

One application of this device is to sense a faint (10-100 nano-Tesla)~1 MHz alternating magnetic field signal from a phone or watch with a device small enough to fit inside of an earbud. In addition to getting rid of the relatively large Bluetooth® antenna (or other wireless antenna) sticking out of current earbuds, this "antenna" consumes about 60 times less power than with standard Bluetooth® antennas or other wireless antennas. This translates to an earbud running for several days between charges instead of a few hours.

An atomically thin electrically conductive membrane, such as graphene, is the ideal material for such uses: it can handle a very high current density (the magnetic force acting on a membrane increases linearly with increasing current density), has very low mechanical inertia (it is 1-2 atoms thick) so it can move in the MHz range and has low mechanical stiffness (so it moves a relatively large amount in reaction to very small magnetic forces).

As shown in FIG. 5, the electrically conductive membrane (i.e., the graphene)"wicks down" the edge of the oxide cavity 455. (This is pointed to with arrow 501). This amount of wicking (caused by van der Waa forces) can be controlled by heating the etched metal-graphene structure (such as a copper-graphene structure) upon which the graphene is grown on (copper expands and graphene contracts when heated so the graphene/g tension increases when the Cu-g is heated) so that very small gaps (5-50 nanometers) can be achieved between the graphene and metal. The sensitivity of the magnetic field sensor is inversely proportional to the size of this gap.

For lower frequency applications, such as brain-computer interfaces (0 to 100 Hz), it is possible to modulate the current in the electrically conductive membrane (such as graphene) at the mechanical resonance frequency of the suspended electrically conductive membrane troughs to gain a factor of 100 to 1000 times in magnetic field sensor sensitivity.

Figure 6A:
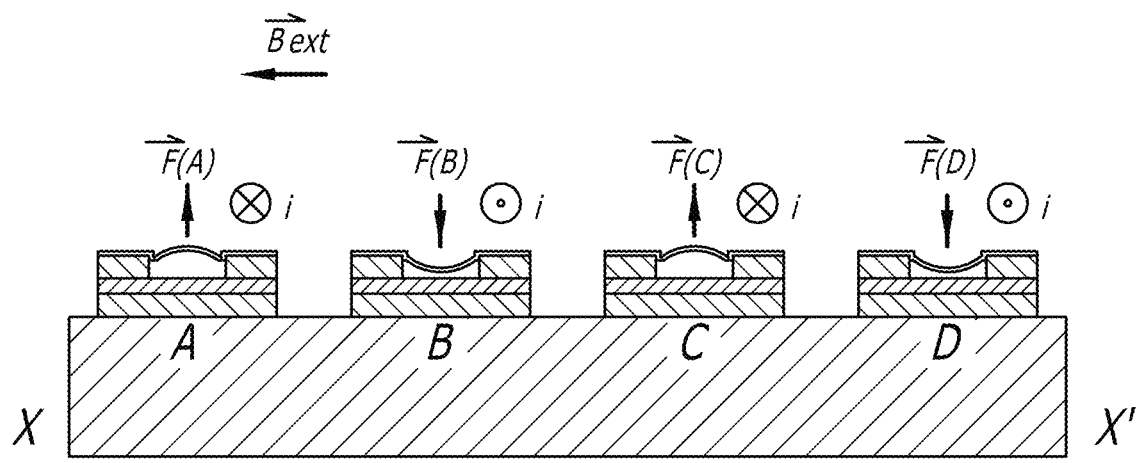
FIG. 6A-6B depict cross-sectional side views as shown in FIG. 5 showing the movement of the electrically conductive membranes using the serpentine shape arrangement, with the depicted adjacent electrically conductive membranes (along cross-sectional side view (X-X')) alternating in their direction of deflection.
Figure 6B:
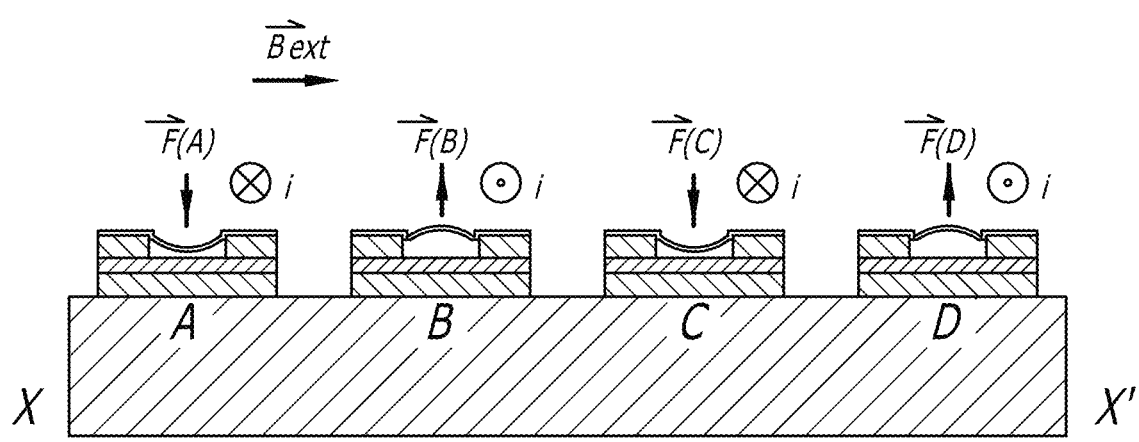

As can be seen in FIGS. 6A-6B, the capacitance of half the traces goes down (the electrically conductive membrane 451 moves away from metal trace 453, such as shown in rows A and C in FIG. 6A and rows B and D in FIG. 6B) and the other half the capacitance goes up (the electrically conductive membrane 451 moves toward the metal trace

453, such as shown in B and D in FIG. 6A and rows A and C in FIG. 6B). This creates a differential capacitance signal that increases sensitivity since one can ignore the overall capacitance and focus just on the change in capacitance.

Figure 7:
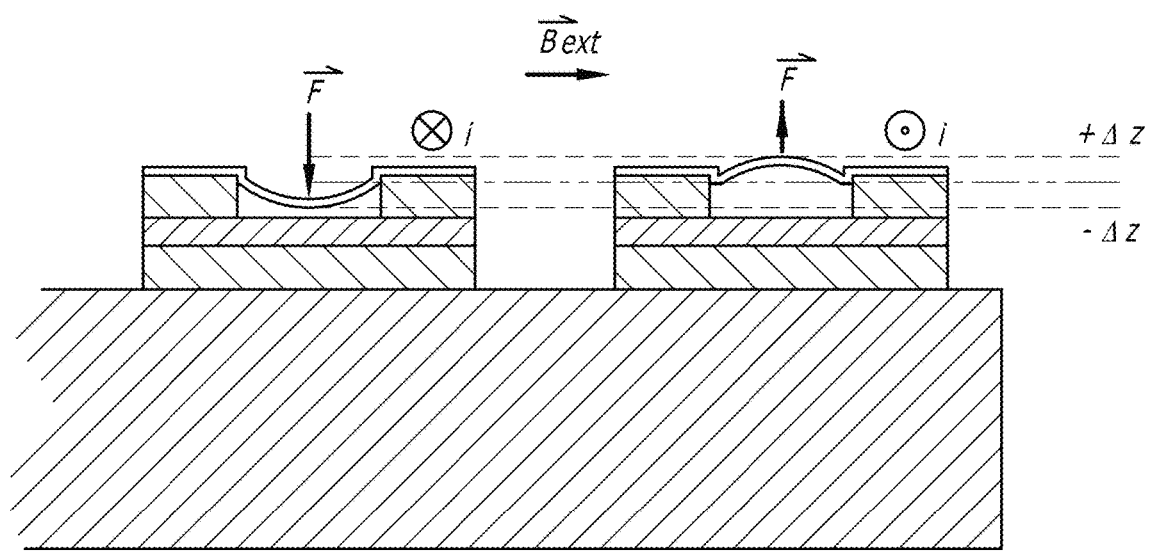
FIG. 7 shows how two adjacent graphene troughs deflect an equal amount but in opposite directions.

FIG. 7 shows that this serpentine design produces equal magnitude deflections that are directed oppositely (one membrane is deflected upward and the other membrane is deflected downward) in adjacent troughs.

Figure 8:
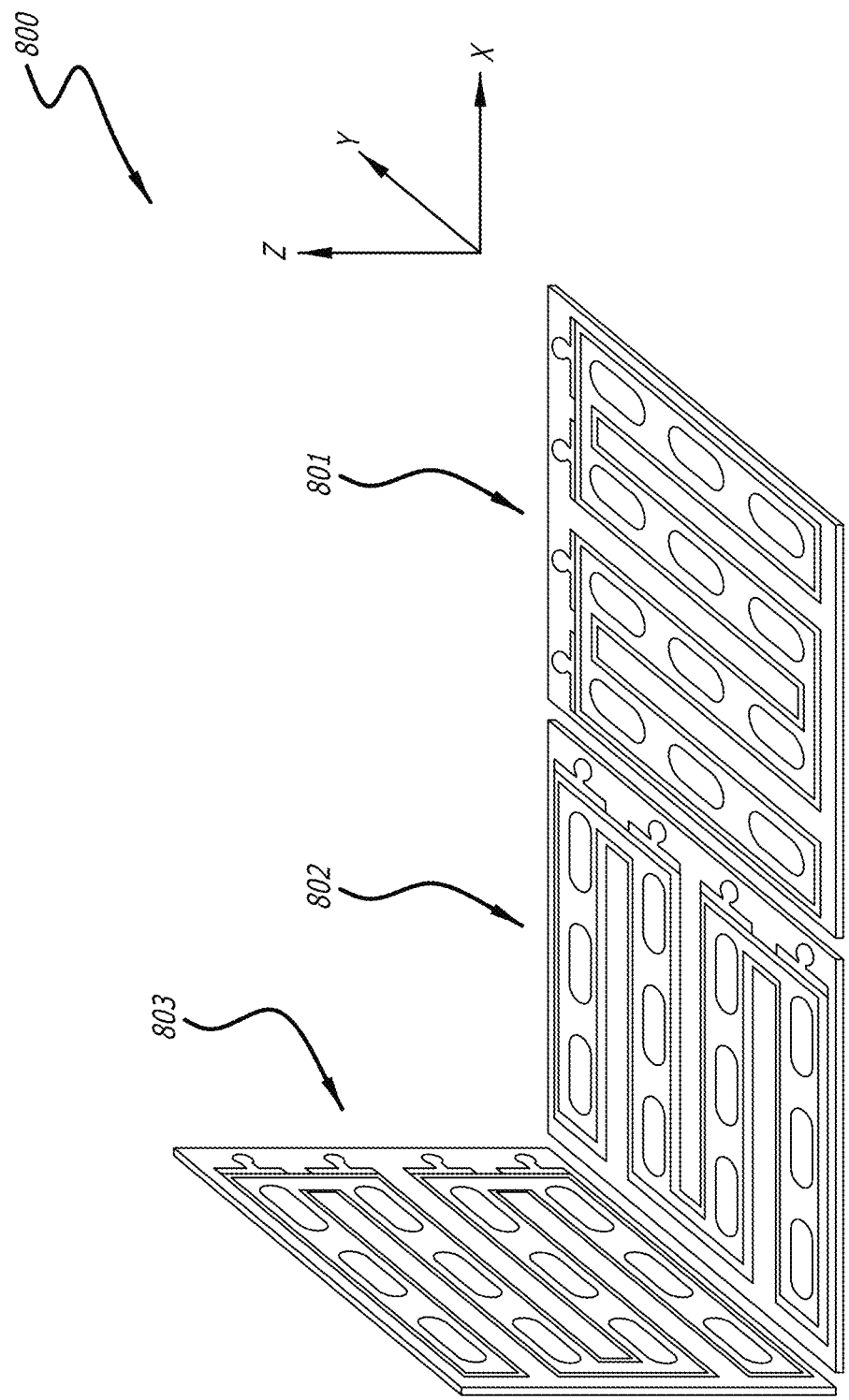
FIG. 8 shows how a combination of three electrically conductive membrane trough chip sections can be arranged in one package (or a NEMS device) to sense along all three axes (x, y and z).

FIG. 8 shows how the electrically-conductive membrane trough chip sections (sections 801-803) can be arranged to sense magnetic field signals along all three directions (as shown in x-y-z axis 800). All three chip sections 801-803 will be housed in a single plastic package. Ideally, these chip sections will operate in a partial vacuum to increase allowable current density through the electrically conductive membrane and increase the mechanical deflection due to mechanical resonance.

Orientation 801 reflects the serpentine arrangement with the oxide troughs oriented along the y-axis. This is similar to as shown in FIG. 4. Orientation 802 reflects the serpentine arrangement with the oxide troughs oriented along the x-axis. Both of these serpentine arrangements of orientations 801-802 are perpendicular to the r-axis. Orientation, 803 reflects the serpentine arrangement with the oxide troughs oriented along the y-axis and the trough chip section oriented along the z-axis. In this orientation 803, the trough chip section is perpendicular to the x-axis.

Embodiments of the present invention can be used a variety of sensors as identified above. Moreover, these can be used as neuron-computer bi-directional interfaces and as a stimulator of excitable tissue, e.g., brain tissue, spinal cord tissue, peripheral nerves, skeletal and heart muscles, etc., and can be used as an interface for functional prosthetics and brain-computer interface devices, including but not limited to, biorobotic, exoskeletons, and implantable devices.

Figure 9A:
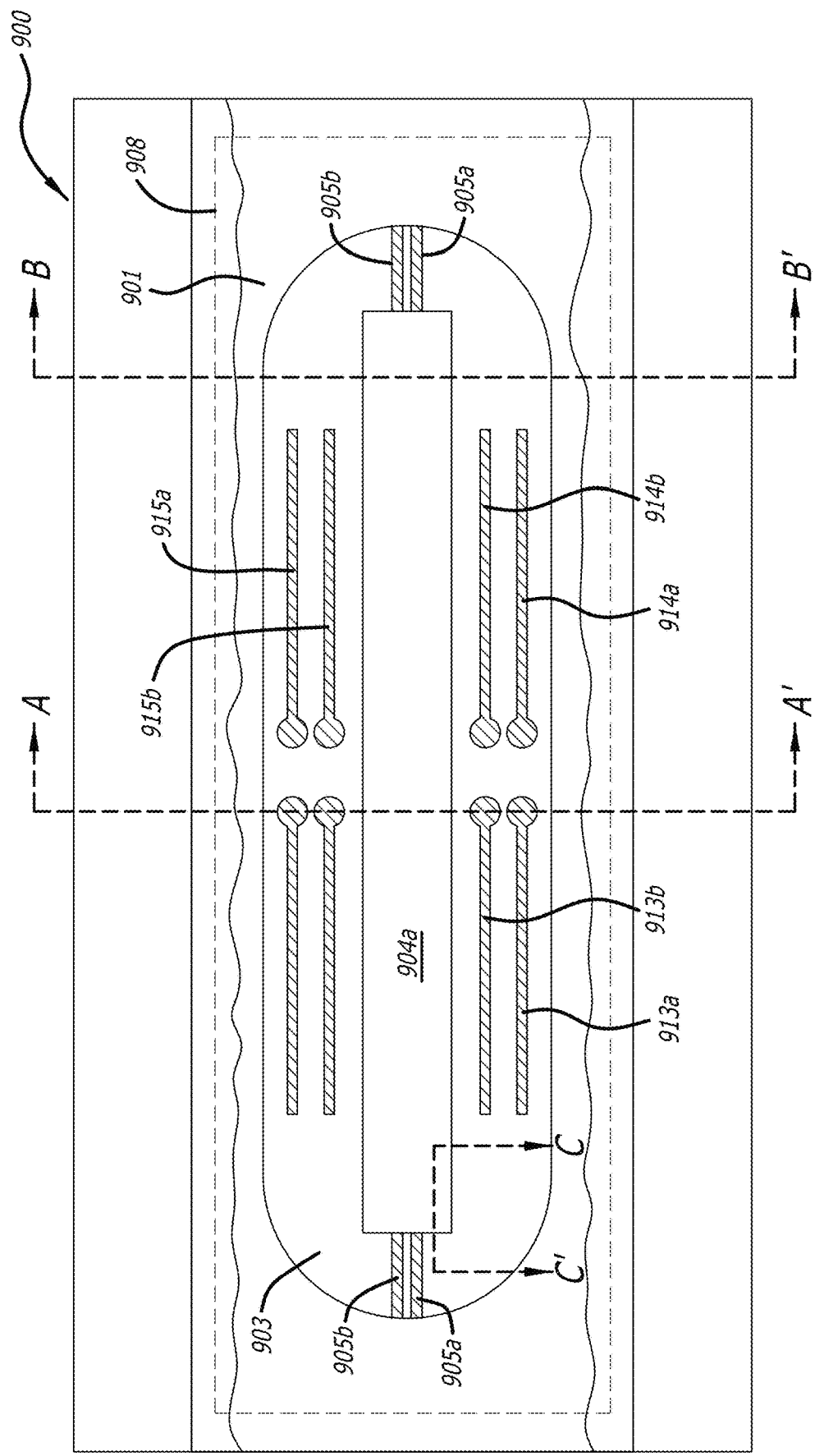
FIG. 9A depicts an illustration of a section of an NEMS sensor device.
Figure 9B:
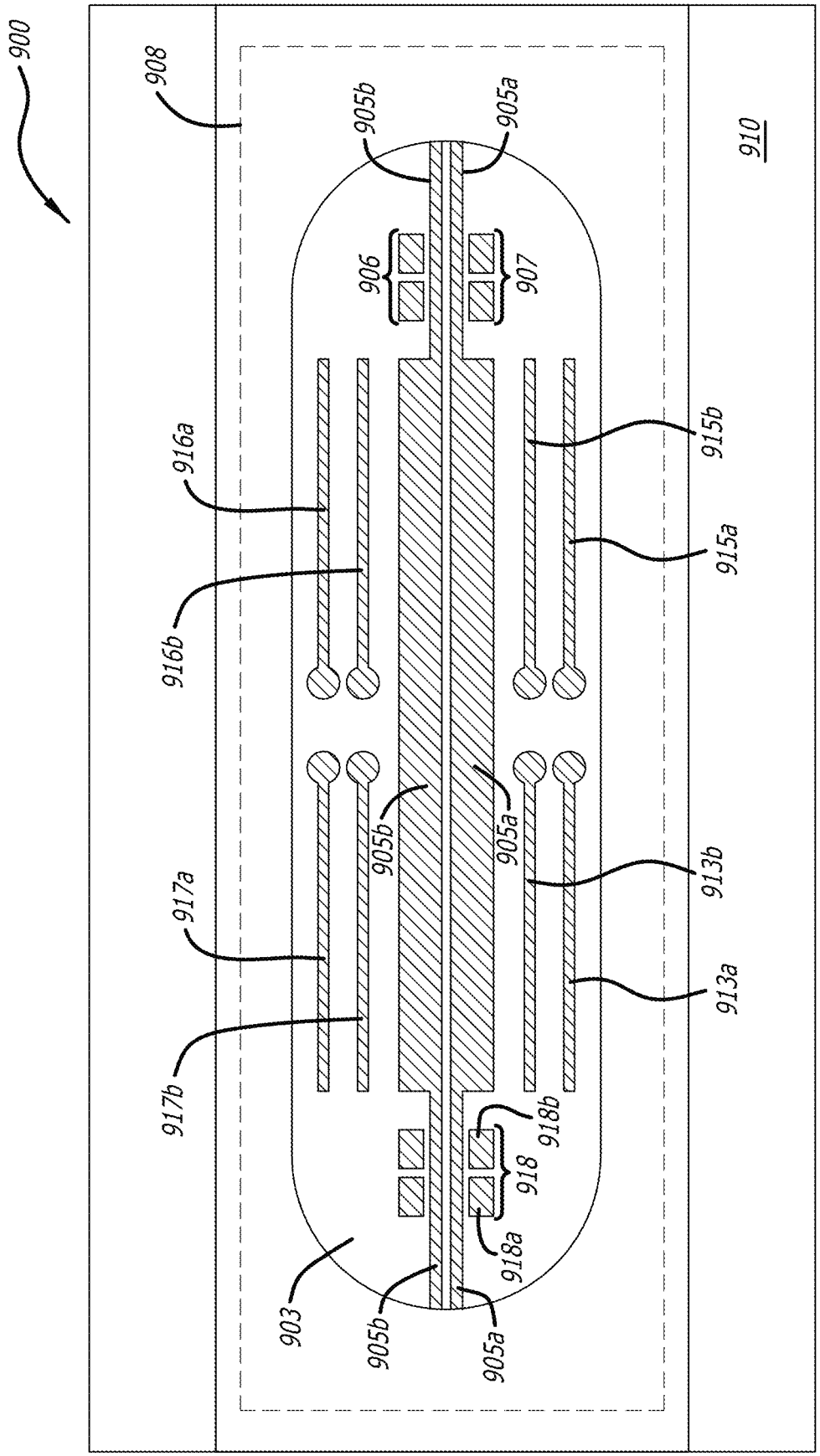
FIG. 9B depicts an illustration of the NEMS sensor device of FIG. 9A without the electrically conductive membrane and electrically conductive membrane structure.
Figure 10A:
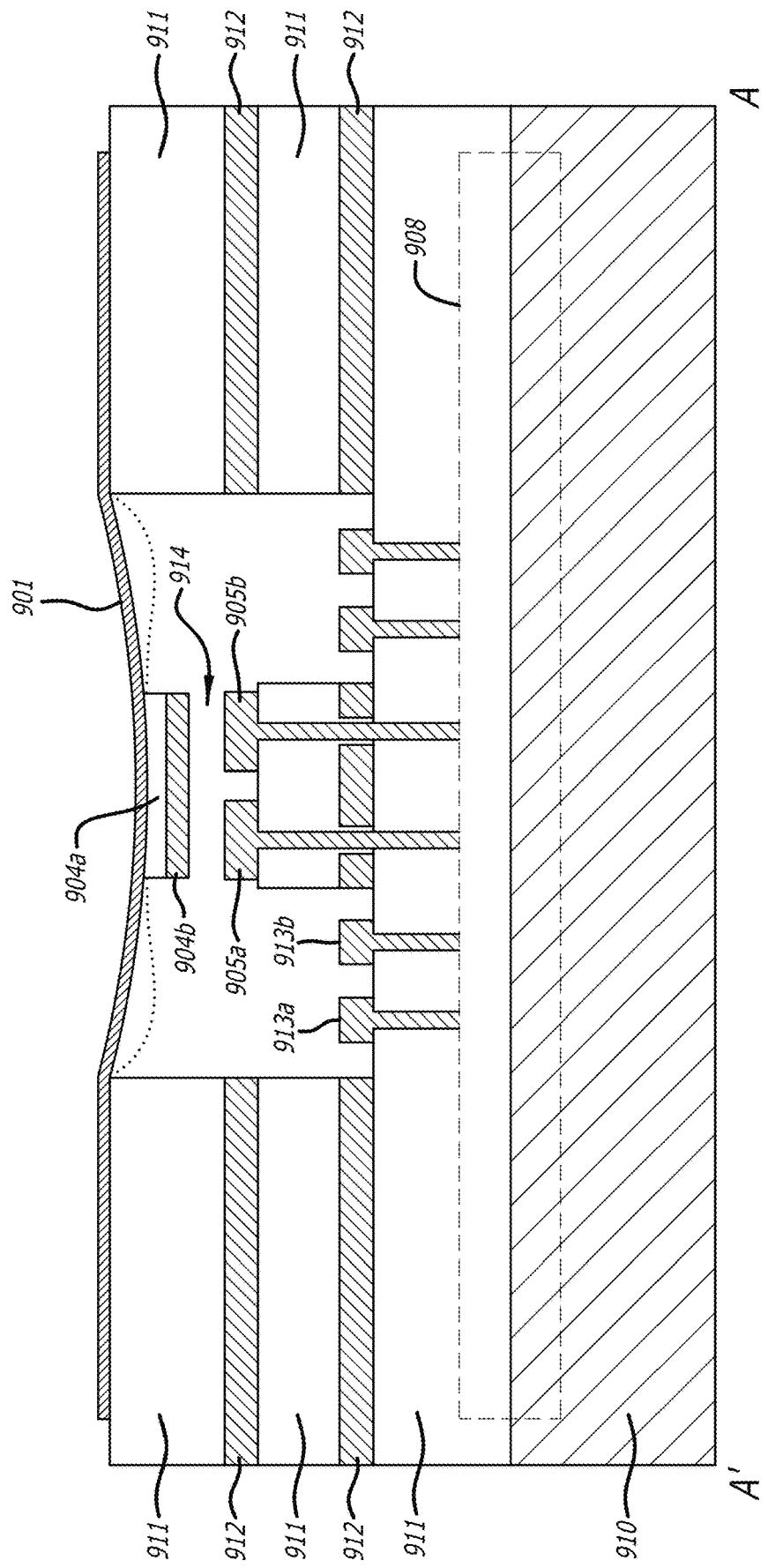
FIG. 10A depicts a cross-sectional side view (A-A') of the section of the NEMS sensor device shown in FIG. 9A.
Figure 10B:
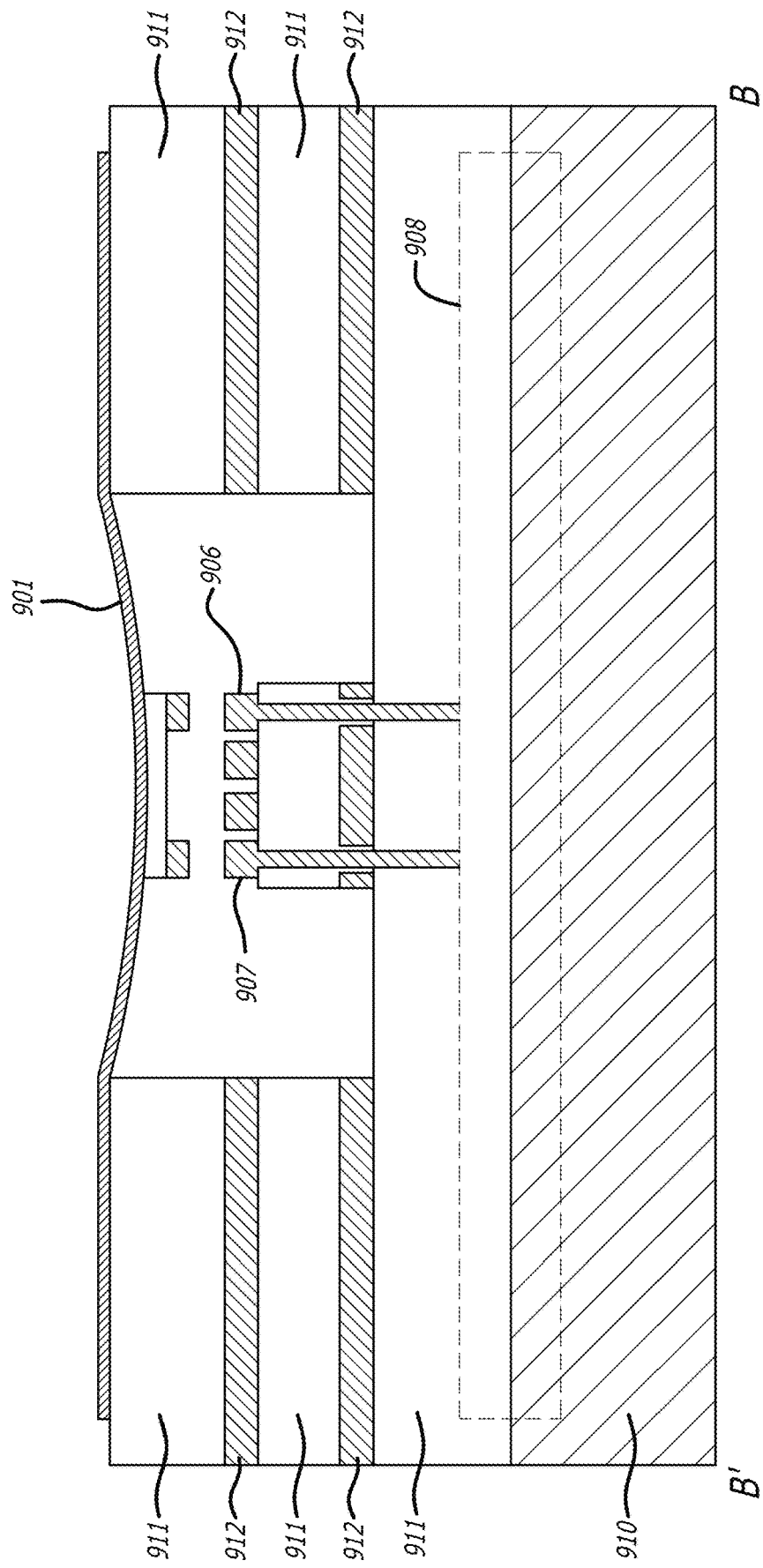
FIG. 10B depicts a cross-sectional side view (B-B') of the section of the NEMS sensor device shown in FIG. 9A.
Figure 10C:
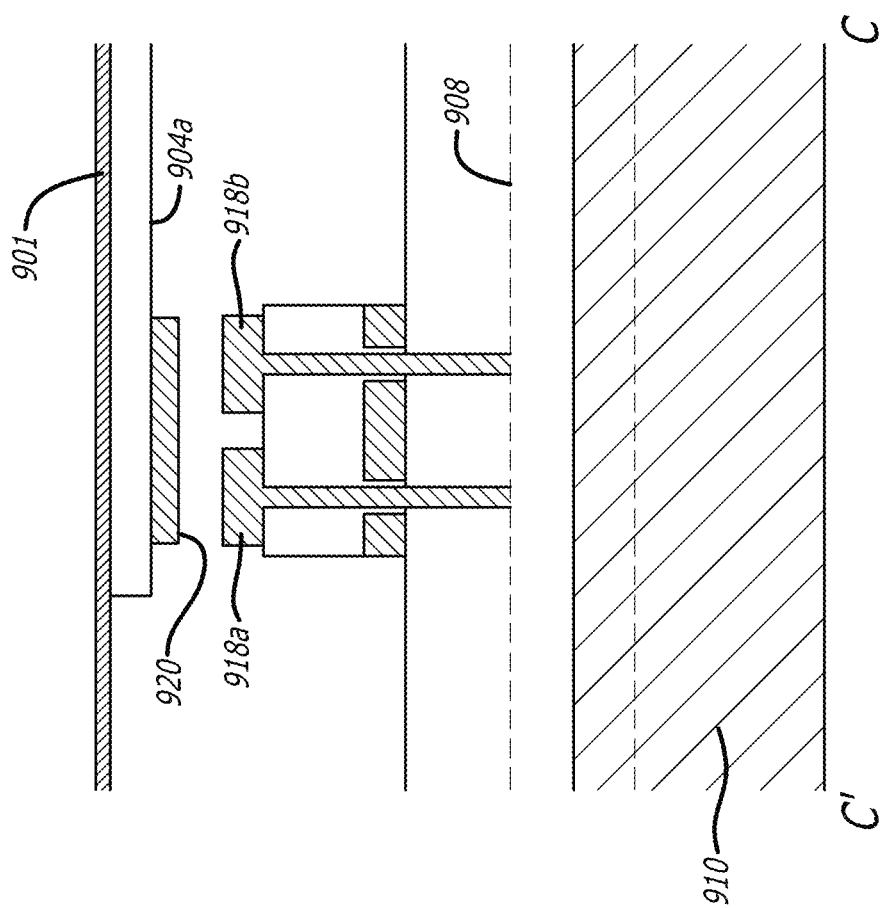
FIG. 10C depicts a cross-sectional side view (C-C') of the section of the NEMS sensor device shown in FIG. 9A

FIG. 9A depicts an illustration of a section 900 of an NEMS sensor device. FIG. 9B depicts section 900 without graphene membrane 901 and added mass (oxide 904a and main membrane trace 904b). FIGS. 10A-10C depict cross-sectional side views (A-A'), (B-B'), and (C-C') respectively, of section 900. FIGS. 9A-9B and 10-10C show one trough sensor but there will be many of these troughs that can be arranged in a serpentine array (such as discussed above).

Such NEMS sensor device are well suited to applications that measure magnetic fields operating below 10 kHz, such as brain-computer interfaces (since there is an added mass (oxide 904a and main membrane trace 904b) on the graphene membrane 901 that makes it difficult to respond to B fields at higher frequencies).

Such a sensor can increase measurement sensitivity in several ways:

It makes the average gap 914 between the main membrane trace 904b and main sensor traces 905a and 905b as small as possible.

It increases the quality factor of the membrane mechanical resonance by adding a mass (oxide 904a and main membrane trace 904b) to the membrane 901.

It is able to maintain an array of tough or drum membranes at a precise mechanical resonant frequency (and compensate for changing conditions such as temperature) so that all of their differential capacitance measurements sum as much as possible.

It is able to compensate for ambient magnetic fields (such as the Earth's magnetic field, which is more than a billion times larger than a typical magnetic field from brain activity).

It is able to increase the current through the graphene membrane by more than 10 times without substantially increasing membrane stiffness by using multiple thin strips of graphene located in the center of the trough or drum-shaped cavity.

These improvements will increase the sensitivity of this magnetic field sensor by at least a factor of 1000.

The oxide 904a and main metal trace 904b structure on the graphene 901 can be made after graphene 901 is grown on a copper substrate. The oxide and then metal (typically gold) will be vapor deposited on top of the graphene-copper.

Generally, the metal surface will then be made smooth/flat with a chemical-mechanical polishing (CMP) process. Photolithography will be used to pattern the oxide-metal islands and then the copper will be etched from the opposite side to form suspended graphene troughs 903. These graphene toughs (with oxide-metal islands attached) are then transferred to the silicon/oxide/metal wafer or "die."

The average gap 914 is minimized by completing the CMP step to the opposing surfaces of (a) main membrane trace 904b of the mass on the membrane 901 facing (b) metal traces 905a and 905b. The CMP step to these opposing surfaces occurs before transferring the graphene membrane array to the silicon 910, oxide 911 and metal 912 substrate. This CMP step can reduce the root-mean-square (RMS) surface roughness from more than 100 nanometers (making gaps less than 100 nanometers impossible) to less than 1 nanometer. The average gap can also be minimized by providing active position feedback using gap sensors, such as gap sensors 906, 907, and 918. FIG. 9B shows two traces for each of the gap sensors, such as sensor traces 918a and 918b for sensor 918, as two traces are needed for each capacitive position sensor. As shown in FIG. 10C, a CMOS circuit 908 below each trough 903 measures the capacitance between a gap sensor (such as gap sensor 918) and the trace above gap sensor 918, which is attached to the moveable membrane 901 (such as trace 920). The movable membrane 901 can be graphene or other conductive material.

By maintaining a constant gap at all four locations (with a reaction time of about 1 Hz to allow the membrane to move freely above a few Hz) the main sensor gap is both small (on the order of 10 nm) and flat. The oxide-metal structure (oxide 904a and metal of main membrane trace 904b) on the membrane 901 is stiffer than the membrane 901 and so it remains relatively flat beneath the main sensor traces 905a-905b (further decreasing the average gap).

For section 900 of an NEMS sensor device, each of the four position sensors are linked with a specific set of electrostatic force traces. I.e., gap sensor 918 is linked with traces 913s-913b, gap sensor 906 is linked with traces 916a-916b, gap sensor 907 is linked with traces 915a-915, and the fourth position sensor, which is not labeled is linked with traces 917a-917b). The membrane 901 can be grounded so that voltages on the traces can create an electrostatic force between themselves and the membrane 901.

Focusing upon the gap sensor 918 linked with traces 913a-913b, the sensor trace 918a in gap sensor 918 is connected to one terminal of an AC circuit (embedded in CMOS circuit 908) and sensor trace 918b in gap sensor 918 is connected to the other terminal. As the gap changes, it changes the capacitance between sensor traces 918a and 918b and this capacitance is measured with the AC circuit embedded in CMOS circuit 908.

Traces 913a-913b can use feedback from gap sensor 918 to pull the membrane down (using an electrostatic force between movable membrane 901 and traces 913a-913b) and into the optimum position. The relative pulling forces of traces 913a-913b can also help minimize the average gap (i.e., pulling harder at trace 913a will make the movable membrane 901 flatter over a larger area than if gate 913b alone were used). Traces 913a-913b also compensate for large stray fields (such as the Earth's magnetic field) by pulling less or more in reaction to the value of these stray fields.

Sensor sensitivity increases linearly with Q (quality factor). Graphene alone can have a Q of about 1000 when operating in a partial vacuum. With the added mass (oxide 904a and main membrane trace 904b), the Q will increase to at least 10,000 (so the sensor is 10 times more sensitive than a device with a Q of 1000). The added mass (oxide 904a and main membrane trace 904b) may also allow the sensor to operate in atmosphere (which is lower cost than a sensor than requires a partial vacuum) while maintaining a Q of about 1000.

Synchronizing the mechanical resonant frequency of many trough magnetic field sensors is very important (otherwise they will all be out of phase and their measurements will not add properly). Graphene membranes have the unusual property of non-linear stiffness for relatively large displacements. This is because there is a term in the graphene membrane stiffness calculation that increases as the cube of membrane displacement. Another way of stating this characteristic is that graphene's stiffness increases with increasing tension of the graphene membrane.

The relative voltages of traces 913a-913b determine the graphene membrane's stiffness, the higher this ratio (voltage of gate 913a relative to gate 913b) the higher the tension. Since resonant frequency increases with the square root of membrane stiffness, increasing the trace 913a to trace 913b voltage ratio (while still maintaining a small average gap) increases the mechanical resonant frequency of the membrane.

A CMOS circuit 90 below each tough 903 can measure the resonant frequency of the membrane and adjust gates 913a-913b until this resonant frequency equals the target resonant frequency for the array of trough sensor membranes. As the temperature (which affects membrane stiffness and thus resonant frequency) of the membrane changes, the CMOS circuit can maintain a constant resonant frequency by adjusting the relative values of the traces 913a-913b voltages. If the gap is becoming too small due to a large stray magnetic field the traces 913a-913b voltage ratio can also be used to rapidly reduce the Q to make sure the gap does not become zero (which might damage the sensor).

The main sensor traces 905a-905b and the gap sensor traces/gates (such as gap sensor traces 906-907) are electrically separated (by using the oxide layers 911 shown in FIGS. 10A-10B) so that their respective signals do not contaminate each other (so "crosstalk" is minimized).

As shown in FIGS. 9A-9B and 10A-10B, the main sense trace and been split into two sense traces 905a-905b so that the sense voltage signals no longer need to be routed through the graphene membrane 901 (which reduces electrical noise due to the relatively high electrical resistance of the long/serpentine graphene membrane/trace). A positive voltage on trace 905a and negative voltage on trace 905b form a variable capacitor through the trace mounted on the moveable oxide/graphene. There are now two capacitor gaps that add in series; from trace 905a to upper trace (main membrane trace 904b) and from upper trace (main membrane trace 904b) to trace 905b. An AC voltage with traces 905a and 905b as the two terminals is used to sense a change in capacitance as the upper trace (main membrane trace 904b) moves toward or away from the stationary traces 905a-905b.

Another improvement is that there is now a synchronization trace that communicates with all of the individual CMOS circuits. Generally, them is one CMOS circuit (represented by dashed box 908 in FIGS. 9A-9B and 10A-10C) for each membrane/trough. The main sense traces 905a-905b can serve as the synchronizing traces in which the metal via structures route from the main sense traces 905s-905b to the CMOS circuitry 908 below to let the CMOS "know" the desired mechanical resonant frequency and phase of the graphene troughs 903. The local gap sense traces and metal traces 913a-913b are each connected to the COMS circuitry 908 with metal via structures. The synchronization trace tells each CMOS circuit 908 the correct frequency and phase for each membrane's mechanical resonant frequency (so they are all in synch and thus their change in capacitance will add as much as possible). If a given membrane/trough 903 is out of synch with the others, the voltages of electrostatic force traces 913a and 913b are adjusted to increase or decrease the tension on the graphene membrane (and thus the stiffness along with mechanical resonant frequency).

In some embodiments, multiple layers of graphene located in the center of each trough 903 will substantially increase the sensor's sensitivity. For example, if nine layers of graphene are used in the center membrane on top of the original single layer that spans the entire trough 903, it will increase the displacement of the membrane 901 for a given external magnetic field by nearly 10 times (and thus increase the sensitivity of the sensor by nearly 10 times). Because the additional layers of graphene are connected at just the right and left edges of the membrane cavity, they do not significantly increase the membrane stiffness (which counteracts gains in electromagnetic force).

Figure 12:
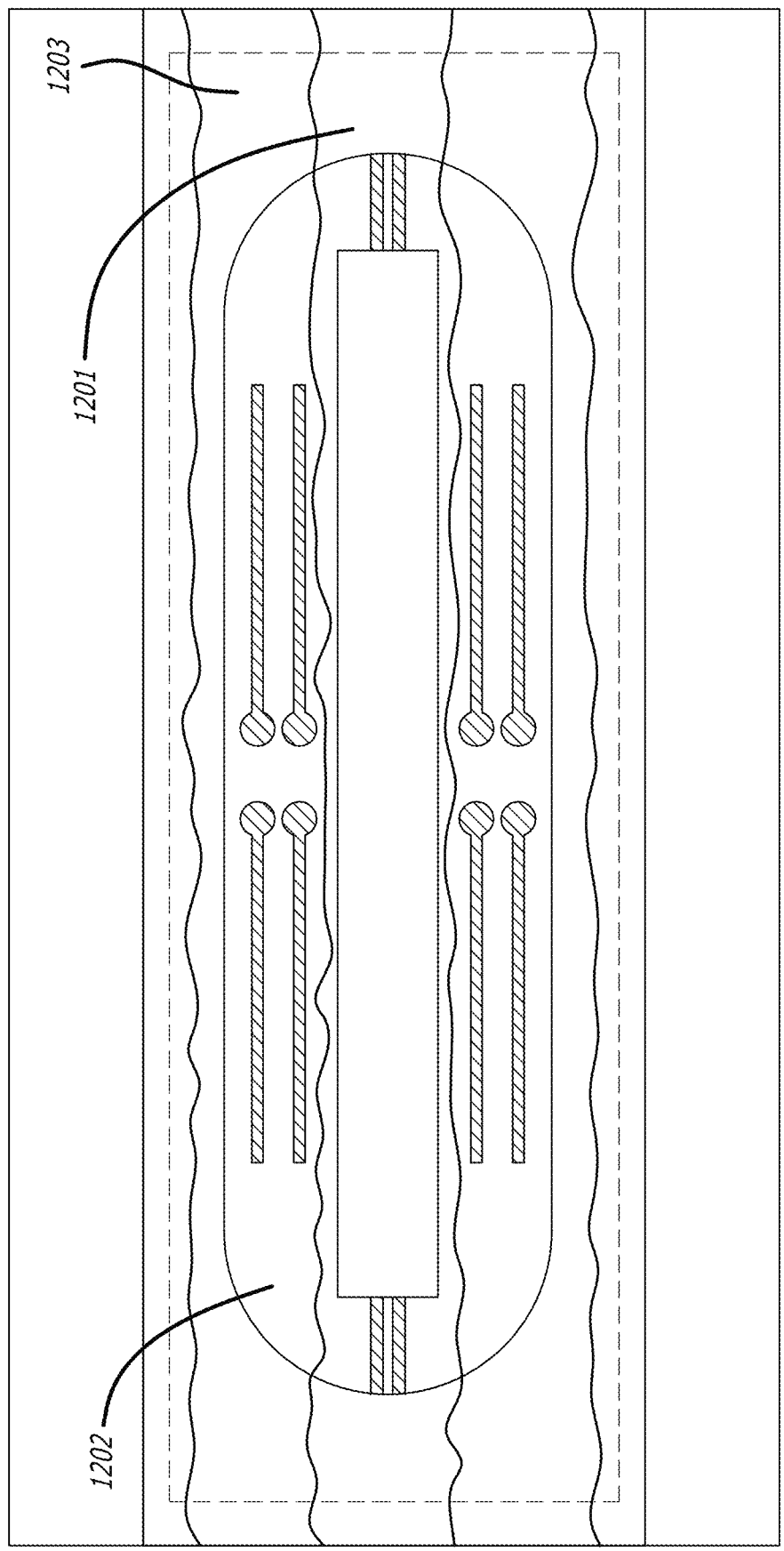
FIG. 12 depicts an illustration of a section of another NEMS sensor device that has additional narrow layer(s) of the electrically conductive membrane along the center of the trough.

The additional layers of narrow graphene can be transferred to the main layer of graphene while this first layer is still on its copper substrate. Multi-layer graphene can be made as previously described, except that before each additional membrane was the same size as the original. In this embodiment, the original trough can be, for example, approximately 300 microns wide and the additional layers can be approximately 100 microns wide (i.e., a 3:1 ratio of the width). Generally, the ratio can be in the range of 4:1 to 2:1. In some embodiments, a thin layer of metal positioned in the center of the main graphene span (either alone or in addition to the narrow layers of graphene as shown in FIG. 12) can also be used to increase the sensor's sensitivity and lower electrical losses Such layers of graphene (or other electrically conductive membrane material) in the center of trough can also boost the sensor's efficiency (the ability to sense a given small magnetic field per watt of losses) in two ways. The first is that forces placed near the center of the trough result in higher membrane displacements (and thus higher sensor sensitivity) than if the force is evenly distributed across the entire trough. Stated another way, for a given electrical current and amount of resistive loss a narrow strip of graphene in the center of the trough will produce a larger membrane displacement. A second way the central graphene layer approach can increase efficiency is that the additional layers lower the electrical resistance of the graphene membrane (and thus lower resistive losses for a given current).

Efficiency and sensor sensitivity can be further enhanced by sandwiching each layer of graphene (or other membrane) between two layers of hexagonal boron nitride. See "Graphene 'sandwich' key to new electronics," EurekAlert!, The Global Source for Science News (Feb. 19, 2019), which is incorporated hemin in its entirety for all purposes.

Figure 11:
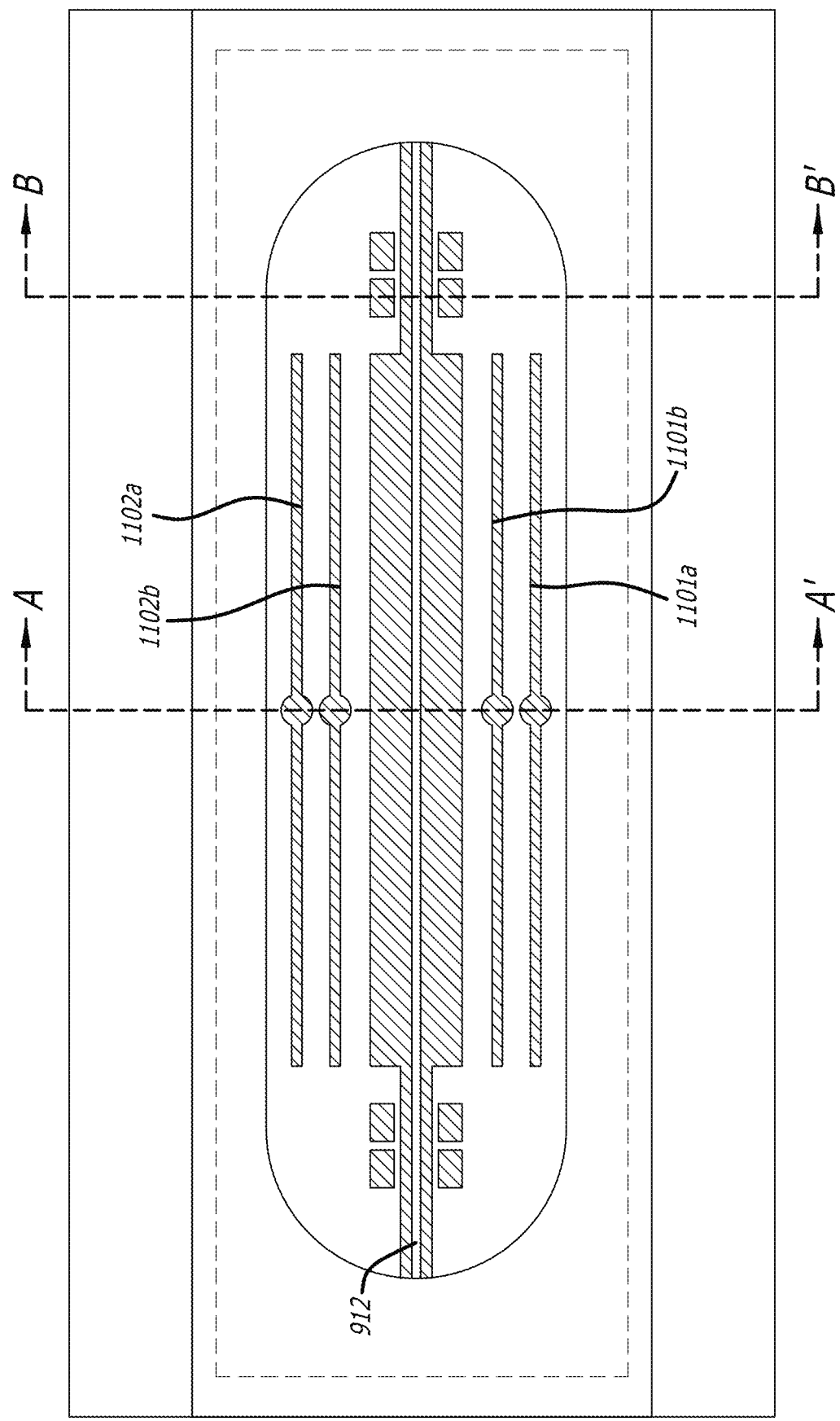
FIG. 11 depicts an illustration of a section of another NEMS sensor device, without the electrically conductive membrane structure on the electrically conductive membrane.

FIG. 11 depicts an illustration of a section of another NEMS sensor device in which there are four electrostatic force traces (traces 1101a-1101b and 1102a-1102b) as compared with the eight electrostatic force traces (traces 913a-913b, 915a-915b, 916a-916b, and 917a-917b) shown in FIG. 9B. In FIG. 11, the electrically conductive membrane is shown without the electrically conductive membrane mass so that the four electrostatic force traces can be more readily viewed.

The cross-sectional side view (A-A') of the section of the NEMS sensor device shown in FIG. 11 (with the electrically conductive membrane also added) is similar to the cross-sectional side view (A-A') of the section of the NEMS sensor device shown in FIG. 9A depicted in FIG. 10A. Likewise, the cross-sectional side view (B-B') of the section of the NEMS sensor device shown in FIG. 11 (with the electrically conductive membrane also added) is similar to the cross-sectional side view (B-B') of the section of the NEMS sensor device shown in FIG. 9A depicted in FIG. 10B.

FIG. 12 depicts an illustration of a section of another NEMS sensor device that has additional narrow electrically conductive membrane layer(s) 1201 along the center of the trough 1202. Additional electrically conductive membrane layer(s) 1201 are in addition to the layer(s) of electrically conductive membrane 1203.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

Amounts and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of approximately 1 to approximately 4.5 should be interpreted to include not only the explicitly recited limits of 1 to approximately 4.5, but also to include individual numerals such as 2, 3, 4, and sub-ranges such as 1 to 3, 2 to 4, etc. The same principle applies to ranges reciting only one numerical value, such as "less than approximately 4.5," which should be interpreted to include all of the above-recited values and ranges. Further, such an interpretation should apply regardless of the breadth of the range or the characteristic being described.

Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are now described.

Following long-standing patent law convention, the terms "a" and "an" mean "one or more" when used in this application, including the claims.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

As used herein, the term "about" and "substantially" when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, the term "substantially perpendicular" and "substantially parallel" is meant to encompass variations of in some embodiments within ±10° of the perpendicular and parallel directions, respectively, in some embodiments within ±5° of the perpendicular and parallel directions, respectively, in some embodiments within ±1° of the perpendicular and parallel directions, respectively, and in some embodiments within ±0.5° of the perpendicular and parallel directions, respectively.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

What is claimed is:

1. A nano-electromechanical system sensor device comprising a section that is oriented along a first plane, wherein the section comprises
   (a) a thin, electrically conductive membrane having a first end and a second end, wherein
      (i) the thin, electrically conductive membrane has a membrane structure deposited on the thin, electrically conductive membrane;
   (b) a substrate oriented parallel to the first plane, wherein
      (i) the substrate comprises a cavity having a substrate metal trace on the substrate, and
      (ii) the thin, electrically conductive membrane is parallel to the first plane, wherein the thin, electrically conductive membrane bounds the cavity;
   (c) a first connector electrically connected to the first end of the thin, electrically conductive membrane; and
   (d) a second connector electrically connected to the second end of the thin, electrically conductive membrane, such that current is operable to flow through the thin, electrically conductive membrane between the first connector and the second connector causing the thin, electrically conductive membrane facing the cavity to deflect in a direction perpendicular to the first plane in the presence of a magnetic field, wherein
      (i) the nano-electromechanical system sensor device is operable to adjust tension of the thin, electrically conductive membrane bounded in the cavity to adjust resonant frequency, and (ii) the deflection of the thin, electrically conductive membrane in a direction perpendicular to the first plane comprises
  (A) a first set of deflections in which the portions of the thin, electrically conductive membrane facing the first portion of the plurality of rows deflect in a direction toward the substrate and the portions of the thin, electrically conductive membrane facing the second portion of rows deflect in a direction away from the substrate, and
  (B) a second set of deflections in which the portions of the thin, electrically conductive membrane facing the first portion of the plurality of rows deflect in the direction away from the substrate and the portions of the thin, electrically conductive membrane facing the second portion of rows deflect in the direction toward the substrate.

2. The nano-electromechanical system sensor device of claim 1, wherein
  (a) the substrate comprises a plurality of cavities; and
  (b) the thin, electrically conductive membrane bounds the plurality of the cavities and provides for a plurality of portions of the thin, electrically conductive membrane that are bound to the plurality of the cavities.

3. The nano-electromechanical system sensor device of claim 2, wherein the plurality of cavities are arranged in a plurality of rows.

4. A nano-electromechanical system sensor device comprising a section that is oriented along a first plane, wherein the section comprises
  (a) a thin, electrically conductive membrane having a first end and a second end, wherein
    (i) the thin, electrically conductive membrane has a membrane structure deposited on the thin, electrically conductive membrane;
  (b) a substrate oriented parallel to the first plane, wherein
    (i) the substrate comprises a cavity having a substrate metal trace on the substrate, and
    (ii) the thin, electrically conductive membrane is parallel to the first plane, wherein the thin, electrically conductive membrane bounds the cavity;
  (c) a first connector electrically connected to the first end of the thin, electrically conductive membrane; and
  (d) a second connector electrically connected to the second end of the thin, electrically conductive membrane, such that current is operable to flow through the thin, electrically conductive membrane between the first connector and the second connector causing the thin, electrically conductive membrane facing the cavity to deflect in a direction perpendicular to the first plane in the presence of a magnetic field, wherein
    (i) the substrate comprises a plurality of cavities,
    (ii) the thin, electrically conductive membrane bounds the plurality of the cavities and provides for a plurality of portions of the thin, electrically conductive membrane that are bound to the plurality of the cavities,
    (iii) the plurality of cavities are arranged in a plurality of rows,
    (iv) the plurality of rows comprises a first portion of the plurality of rows and a second portion of the plurality of rows, and
    (v) the deflection of the thin, electrically conductive membrane in a direction perpendicular to the first plane comprises
      (A) a first set of deflections in which the portions of the thin, electrically conductive membrane facing the first portion of the plurality of rows deflect in a direction toward the substrate and the portions of the thin, electrically conductive membrane facing the second portion of rows deflect in a direction away from the substrate, and
      (B) (ii) a second set of deflections in which the portions of the thin, electrically conductive membrane facing the first portion of the plurality of rows deflect in the direction away from the substrate and the portions of the thin, electrically conductive membrane facing the second portion of rows deflect in the direction toward the substrate.

5. The nano-electromechanical system sensor device of claim 1, wherein
  (a) the substrate has a substrate non-electrically conductive layer; and
  (b) the thin, electrically conductive membrane is on the substrate non-electrically conductive layer.

6. The nano-electromechanical system sensor device of claim 1, wherein the thin, electrically conductive membrane is in a serpentine shape.

7. The nano-electromechanical system sensor device of claim 1, wherein the membrane structure is within the cavity.

8. The nano-electromechanical system sensor device of claim 1, wherein the membrane structure comprises an electrically conductive layer that is a main membrane trace.

9. The nano-electromechanical system sensor device of claim 8 further comprising a gap sensor within the cavity, wherein the gap sensor is operable for providing position feedback of the gap between the substrate metal trace and the main membrane trace.

10. The nano-electromechanical system sensor device of claim 8, wherein the main membrane trace of the thin, electrically conductive membrane faces the substrate metal trace at a gap distance of between 5 nm and 50 nm.

11. The nano-electromechanical system sensor device of claim 1, wherein the nano-electromechanical system sensor device is operable for measuring a magnetic field operating below 10 kHz.

12. The nano-electromechanical system sensor device of claim 1, wherein the nano-electromechanical system sensor device is operable to maintain the thin, electrically conductive membrane bounded in the cavity at a pre-determined resonant frequency.

13. The nano-electromechanical system sensor device of claim 1, wherein the thin, electrically conductive membrane has a thickness of approximately one nm.

14. The nano-electromechanical system sensor device of claim 1, wherein the thin, electrically conductive membrane has a thickness between 1 nm and 25 nm.

15. The nano-electromechanical system sensor device of claim 1, wherein the thin, electrically conductive membrane is selected from a group consisting of graphene, graphene oxide, graphene/graphene oxide composites, and electrically conductive polymers.

16. The nano-electromechanical system sensor device of claim 1, wherein the thin, electrically conductive membrane comprises PDMS coated with an electrically conductive material.

17. The nano-electromechanical system sensor device of claim 1, wherein
  (a) the nano-electromechanical systems device comprises two sections; and
  (b) the sections are perpendicular to one another.

18. The nano-electromechanical system sensor device of claim 1, wherein (a) the nano-electromechanical systems device comprises three sections; and (b) the sections are each perpendicular to one another.

19. The nano-electromechanical system sensor device of claim 1, wherein the nano-electromechanical system sensor device is operable to sense an alternating magnetic field signal.

20. The nano-electromechanical system sensor device of claim 18, wherein the alternating magnetic field signal is between 1 and 100 femto-tesla.

21. The nano-electromechanical system sensor device of claim 1, wherein the nano-electromechanical system sensor device is operable to adjust the tension of the thin, electrically conductive membrane to adjust the stiffness of the thin, electrically conductive membrane bounded in the cavity.

22. The nano-electromechanical system sensor device of claim 1, wherein
   (a) the nano-electromechanical system sensor device comprises CMOS circuit, a first electrostatic force trace, and a second electrostatic force trace;
   (b) the CMOS circuit is operable to measure resonant frequency of the thin, electrically conductive membrane bounded in the cavity; and
   (c) the first electrostatic force trace and the second electrostatic force trace are operable to adjust the resonant frequency to a desired resonant frequency.

23. The nano-electromechanical system sensor device of claim 22, wherein
   (a) the first electrostatic force trace and the second electrostatic force trace are operable to increase the tension of the thin, electrically conductive membrane bounded in the cavity by increasing voltage on the first electrostatic force trace while decreasing voltage on the second electrostatic force trace; and
   (b) the first electrostatic force trace and the second electrostatic force trace are operable to decrease the tension of the thin, electrically conductive membrane bounded in the cavity by decreasing voltage on the first electrostatic force trace while increasing voltage on the second electrostatic force trace.

24. The nano-electromechanical system sensor device of claim 1, wherein the nano-electromechanical system sensor device is operable to adjust the tension of the thin, electrically conductive membrane bounded in the cavity while maintaining a near constant gap between the substrate metal trace and a main membrane trace.

* * * * *